(12) United States Patent
Lee (10) Patent No.: US 11,509,218 B2
(45) Date of Patent: Nov. 22, 2022

(54) WIRELESS POWER RECEIVER

(71) Applicant: Samsung Electronics Co., Ltd., Suwon-si (KR)

(72) Inventor: Hankyu Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 680 days.

(21) Appl. No.: 16/377,510

(22) Filed: Apr. 8, 2019

(65) Prior Publication Data

US 2020/0186033 A1    Jun. 11, 2020

(30) Foreign Application Priority Data

Dec. 11, 2018 (KR) .................. 10-2018-0158847

(51) Int. Cl.
| | |
|---|---|
| *H02M 3/158* | (2006.01) |
| *H02J 7/02* | (2016.01) |
| *H02M 7/219* | (2006.01) |
| *G01R 19/165* | (2006.01) |
| *H02J 50/10* | (2016.01) |
| *H02M 1/00* | (2006.01) |

(52) U.S. Cl.
CPC ...... *H02M 3/158* (2013.01); *G01R 19/16542* (2013.01); *H02J 7/025* (2013.01); *H02J 50/10* (2016.02); *H02M 7/219* (2013.01); *H02M 1/0003* (2021.05)

(58) Field of Classification Search
CPC .... H02M 3/158; H02M 7/219; H02M 1/0003; H02J 50/01; H02J 7/025; G01R 19/16542
USPC ........................................................ 320/108
See application file for complete search history.

(56) References Cited

U.S. PATENT DOCUMENTS

| | | | |
|---|---|---|---|
| 6,909,617 B1 * | 6/2005 | Mirskiy | H02M 3/3376 |
| | | | 363/17 |
| 6,952,353 B2 | 10/2005 | Yan et al. | |
| 9,490,653 B2 * | 11/2016 | Shevde | H02J 7/045 |
| 9,490,704 B2 | 11/2016 | Jang et al. | |
| 9,602,057 B1 * | 3/2017 | Youn | H03F 3/195 |
| 9,712,050 B2 | 7/2017 | Ribarich | |
| 9,800,172 B1 * | 10/2017 | Leabman | H02M 3/158 |
| 2003/0038612 A1 * | 2/2003 | Kutkut | H02M 3/33561 |
| | | | 320/140 |
| 2006/0221652 A1 | 10/2006 | Marchand et al. | |
| 2010/0165686 A1 | 7/2010 | Matzberger et al. | |

(Continued)

FOREIGN PATENT DOCUMENTS

| | | | | |
|---|---|---|---|---|
| CN | 110504874 A | * | 11/2019 | |
| DE | 102018132215 A1 | * | 6/2020 | B60L 53/14 |

(Continued)

OTHER PUBLICATIONS

Richelli A., et al., "A Fully Integrated Inductor-Based 1.8-6-V Step-Up Converter", *IEEE Journal of Solid-State Circuits*, vol. 39, No. 1, Jan. 2004, pp. 242-245 (4 pages in English).

(Continued)

*Primary Examiner* — Suresh Memula
(74) *Attorney, Agent, or Firm* — NSIP Law (57) ABSTRACT

A wireless power receiver includes a rectifier configured to convert a radio frequency (RF) voltage signal generated based on an RF input to a direct current (DC) voltage, and a boost converter configured to generate a voltage for battery charging using the RF voltage signal as a switching signal.

27 Claims, 6 Drawing Sheets

(56) References Cited

U.S. PATENT DOCUMENTS

| | | | | |
|---|---|---|---|---|
| 2010/0181961 A1* | 7/2010 | Novak | ............... | H02J 50/10 |
| | | | | 320/108 |
| 2011/0149613 A1 | 6/2011 | Lanni | | |
| 2015/0028803 A1* | 1/2015 | Shevde | ............... | H02J 7/045 |
| | | | | 320/108 |
| 2017/0070096 A1 | 3/2017 | Madawala et al. | | |
| 2017/0237340 A1 | 8/2017 | Long et al. | | |
| 2019/0288568 A1* | 9/2019 | Ogura | ............... | H02J 50/10 |
| 2021/0091602 A1* | 3/2021 | Woo | ............... | H02J 50/27 |

FOREIGN PATENT DOCUMENTS

| | | |
|---|---|---|
| JP | 6202222 B2 | 9/2017 |
| KR | 10-2004-0098819 A | 11/2004 |
| KR | 10-0869229 B1 | 11/2008 |
| KR | 10-2014-0060865 A | 5/2014 |
| KR | 10-2018-0008817 A | 1/2018 |
| KR | 10-1839527 B1 | 3/2018 |
| WO | WO-2009063214 A1 * | 5/2009 ............... G05F 1/46 |

OTHER PUBLICATIONS

Andrews C., et al., "A Wideband Receiver With Resonant Multi-Phase LO and Current Reuse Harmonic Rejection Baseband", *IEEE Journal of Solid-State Circuits*, vol. 48 No. 5, May 2013, pp. 1188-1198 (11 pages in English).

Choi P, et al., "A Fully Integrated Inductor-Based GaN Boost Converter With Self-Generated Switching Signal for Vehicular Applications", *IEEE Transactions on Power Electronics*, vol. 31, No. 8, Aug. 2016, pp. 5365-5368 (4 pages in English).

Abdelfattah M., et al., "An On-Chip Resonant-Gate-Drive Switched-Capacitor Converter for Near-Threshold Computing Achieving 70.2% Efficiency at 0.92A/mm2 Current Density and 0.4V Output", *IEEE International Solid-State Circuits Conference*, Feb. 2018, pp. 438-440 (3 pages in English).

* cited by examiner

WIRELESS POWER RECEIVER

CROSS-REFERENCE TO RELATED APPLICATIONS

This application claims the benefit under 35 USC § 119 a) of Korean Patent Application No. 10-2018-0158847 filed on Dec. 11, 2018 in the Korean Intellectual Property Office, the entire disclosure of which is incorporated herein by reference for all purposes.

BACKGROUND

1. Field

The following description relates to a wireless power receiver.

2. Description of Related Art

In a general wireless power receiver, an external inductor may be used as a boost converter for battery charging. For example, when an inductor used in a wireless power receiver circuit is integrated into a chip, a conduction loss, by resistance components of the inductor and a switch, and a switching loss for operating the switch may occur. To reduce the switching loss and the conduction loss, the operating frequency may be lowered by using an external inductor having a relatively high inductance and a relatively low resistance component. However, the external inductor may significantly increase the size and price of a wireless power reception system.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a wireless power receiver includes a rectifier configured to convert a radio frequency (RF) voltage signal generated based on an RF input to a direct current (DC) voltage; and a boost converter configured to generate a voltage for battery charging using the RF voltage signal as a switching signal.

The rectifier may be a full-bridge rectifier.

The boost converter may include a first inductor configured to generate a first inductor current for the battery charging based on the DC voltage; a first switch configured to form the first inductor current of the first inductor by using the RF voltage signal as the switching signal; and a first diode configured to transmit the first inductor current.

The RF voltage signal may include a first RF voltage signal of a first half-sine waveform and a second RF voltage signal of a second half-sine waveform.

The first switch may be configured to form the first inductor current by using the first RF voltage signal as the switching signal.

The boost converter may further include a capacitor configured to receive the second RF voltage signal.

A gate capacitor of the first switch may be used as a matching capacitor of an antenna configured to receive the RF input.

The boost converter may further include an enable switch configured to connect in series to the first switch and to determine whether to enable a boosting operation of the boost converter; and a control logic configured to control powering ON/OFF of the enable switch based on a result of comparing each of an input voltage of the boost converter and an output voltage of the boost converter and a threshold voltage preset for each of the input voltage of the boost converter and the output voltage of the boost converter.

The control logic is configured to turn OFF the enable switch and turn ON the boost converter in response to the input voltage of the boost converter being greater than a first threshold voltage preset for the input voltage of the boost converter and the output voltage of the boost converter being less than a second threshold voltage preset for the output voltage of the boost converter. The control logic may be configured to turn ON the enable switch and turn OFF the boost converter in response to the input voltage of the boost converter being less than or equal to the first threshold voltage and the output voltage of the boost converter being greater than or equal to the second threshold voltage.

The RF voltage signal may include a first RF voltage signal of a first half-sine waveform and a second RF voltage signal of a second half-sine waveform, and the boost converter may include a first boost converter configured to form and transmit a first inductor current of a first inductor by using the first RF voltage signal as a switching signal of a first switch; and a second boost converter configured to form and transmit a second inductor current of a second inductor by using the second RF voltage signal as a switching signal of a second switch.

The second boost converter may include the second inductor configured to generate the second inductor current for the battery charging based on the DC voltage; a second switch configured to form the second inductor current of the second inductor of the second by using the second RF voltage signal as the switching signal of the second inductor; and a second diode configured to transmit the second inductor current.

Either one or both one of the first inductor and the second inductor may be an on-chip inductor.

In another general aspect, a method of controlling a wireless power receiver includes receiving a radio frequency (RF) input through an antenna; generating an RF voltage signal that includes a first RF voltage signal of a first half-sine waveform and a second RF voltage signal of a second half-sine waveform based on the RF input; converting the RF voltage signal to a direct current (DC) voltage; generating a first inductor current for battery charging based on the DC voltage, in response to a switching signal corresponding to the RF voltage signal; and charging a battery by the first inductor current.

The wireless power receiver control method may further include controlling a boosting operation in response to the switching signal, based on a result of comparing the DC voltage and a preset first threshold voltage and a result of comparing a charging voltage of the battery and a preset second threshold voltage.

The controlling of the boosting operation may include inactivating the boosting operation in response to the DC voltage being less than or equal to the first threshold voltage or the battery charging voltage being greater than or equal to the second threshold voltage; and activating the boosting operation in response to the DC voltage being greater than the first threshold voltage and the charging voltage of the battery being less than the second threshold voltage.

In another general aspect, a method of controlling a wireless power receiver includes converting, using a rectifier, a radio frequency (RF) voltage signal of an RF input signal to a direct current (DC) voltage; and generating a voltage for charging a battery based on using the RF voltage signal as a switching signal.

The rectifier may be a full-bridge rectifier.

A boost converter may generate the voltage for charging the battery, and the boost converter may include a first inductor configured to generate a first inductor current for the charging of the battery based on the DC voltage; a first switch configured to form the first inductor current of the first inductor using the RF voltage signal as the switching signal; and a first diode configured to transmit the first inductor current.

The RF voltage signal may include a first RF voltage signal of a first half-sine waveform and a second RF voltage signal of a second half-sine waveform.

The first switch may be configured to form the first inductor current using the first RF voltage signal as the switching signal.

The boost converter may further include a capacitor configured to receive the second RF voltage signal.

A gate capacitor of the first switch may be used as a matching capacitor of an antenna configured to receive the RF input.

The boost converter may further include an enable switch configured to connect in series to the first switch and to determine whether to enable a boosting operation of the boost converter; and a control logic configured to control powering ON/OFF of the enable switch based on a result of comparing each of an input voltage of the boost converter and an output voltage of the boost converter, and a threshold voltage preset for each of the input voltage of the boost converter and the output voltage of the boost converter.

The control logic may be configured to turn OFF the enable switch and turn ON the boost converter in response to the input voltage of the boost converter being greater than a first threshold voltage preset for the input voltage of the boost converter and the output voltage of the boost converter being less than a second threshold voltage preset for the output voltage of the boost converter, and the control logic may be configured to turn ON the enable switch and turn OFF the boost converter in response to the input voltage of the boost converter being less than or equal to the first threshold voltage and the output voltage of the boost converter being greater than or equal to the second threshold voltage.

Other features and aspects will be apparent from the following detailed description, the drawings, and the claims.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

The terminology used herein is for the purpose of describing particular examples only, and is not intended to limit the disclosure or claims. The singular forms "a," "an," and "the" include the plural forms as well, unless the context clearly indicates otherwise. The terms "comprises," "comprising," "includes," and "including" specify the presence of stated features, numbers, operations, elements, components, or combinations thereof, but do not preclude the presence or addition of one or more other features, numbers, operations, elements, components, or combinations thereof.

Unless otherwise defined, all terms, including technical and scientific terms, used herein have the same meaning as commonly understood to which this disclosure pertains and in view of the disclosure of this application based on an understanding of the present disclosure. Terms, such as those defined in commonly used dictionaries, are to be interpreted as having a meaning that is consistent with their meaning in the context of the relevant art and the present disclosure, and are not to be interpreted in an idealized or overly formal sense unless expressly so defined herein.

Hereinafter, the examples are described with reference to the accompanying drawings. Like reference numerals used herein may refer to like elements throughout.

Figure 1:
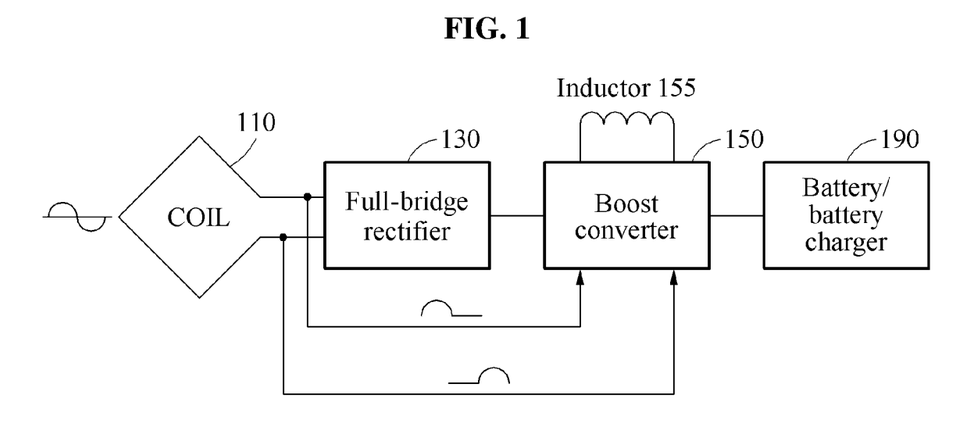
FIG. 1 illustrates an example of a wireless power receiver.

FIG. 1 illustrates an example of a wireless power receiver. Referring to FIG. 1, the wireless power receiver includes an antenna 110, a full-bridge rectifier 130, a boost converter 150, and an inductor 155. Here, the antenna 110 functions as a coil and the terms "antenna" and "coil" are interchangeably used herein.

The antenna 110 receives a radio frequency (RF) signal transmitted from a transmission side. The RF signal may be, for example, an alternating current (AC) voltage.

The full-bridge rectifier 130 converts, to a direct current (DC) voltage, an RF voltage signal of a half-sine waveform that is generated based on an RF input received through the antenna 110. For example, the RF voltage signal may be an RF voltage signal of a differential half-sine waveform. The RF voltage signal may have a DC voltage. For example, the RF voltage signal may include a first RF voltage signal of a first half-sine waveform and a second RF voltage signal of a second half-sine waveform. A process of generating an RF voltage signal of a half-sine waveform using the full-bridge rectifier 130 will be described with reference to FIG. 2.

The boost converter 150 may generate a voltage for charging of the battery (or a battery charger) 190 by using the RF voltage signal generated by the full-bridge rectifier 130 as a switching signal. Here, the inductor 155 may be included in the boost converter 150.

Depending on examples, the boost converter 150 of the wireless power receiver may include single or multiple boost converters, for example, a first boost converter and a second boost converter. An example of the wireless power receiver that includes a single boost converter will be described with reference to FIG. 3. Also, an example of the wireless power receiver that includes two boost converters will be described with reference to FIG. 6.

In an example where a separate switching signal generation circuit is absent, the RF voltage signal may be immediately used as the switching signal of the boost converter 150 based on a characteristic of the full-bridge rectifier 130. Also, by using the RF voltage signal as the switching signal, a high-frequency signal may be transmitted to a switch of the boost converter 150 without using additional power. In addition, the operating frequency of the boost converter 150 may increase without causing a switching loss by reducing the size of the switch through switching using the RF voltage signal, and the inductor 155 may be configured as an on-chip inductor by reducing an inductance requirement.

Figure 2:
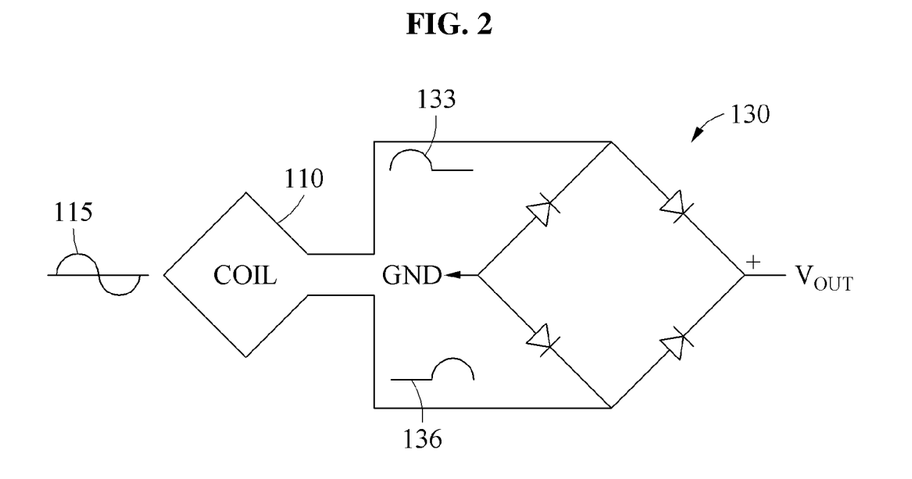
FIG. 2 illustrates an example of a circuit diagram to describe an operation of a full-bridge rectifier.

FIG. 2 illustrates an example of a circuit diagram to describe an operation of a full-bridge rectifier. FIG. 2 illustrates the full-bridge rectifier 130. The full-bridge rectifier 130 converts an alternating current (AC) voltage, having both a negative voltage and a positive voltage, to a DC voltage of a single direction, for example, a + direction. For example, the full-bridge rectifier 130 may convert an RF voltage signal 115 to the RF voltage signal 115 of a differential half-sine waveform.

Here, an amplitude of a half-sine waveform is greater than an output voltage $V_{OUT}$ of the full-bridge rectifier 130, that is, an input voltage of the boost converter 150 at all times. The RF voltage signal 115 includes a first RF voltage signal 133 of a first half-sine waveform and a second RF voltage signal 136 of a second half-sine waveform.

In one example, by using the RF voltage signal 115 of the half-sine waveform that is generated by the full-bridge rectifier 130 as the switching signal of the boost converter 150, the boost converter 150 may be operated at a very fast frequency without causing a separate power consumption. Also, by operating the boost converter 150 at a fast frequency, it is possible to reduce inductance and switching losses.

Figure 3:
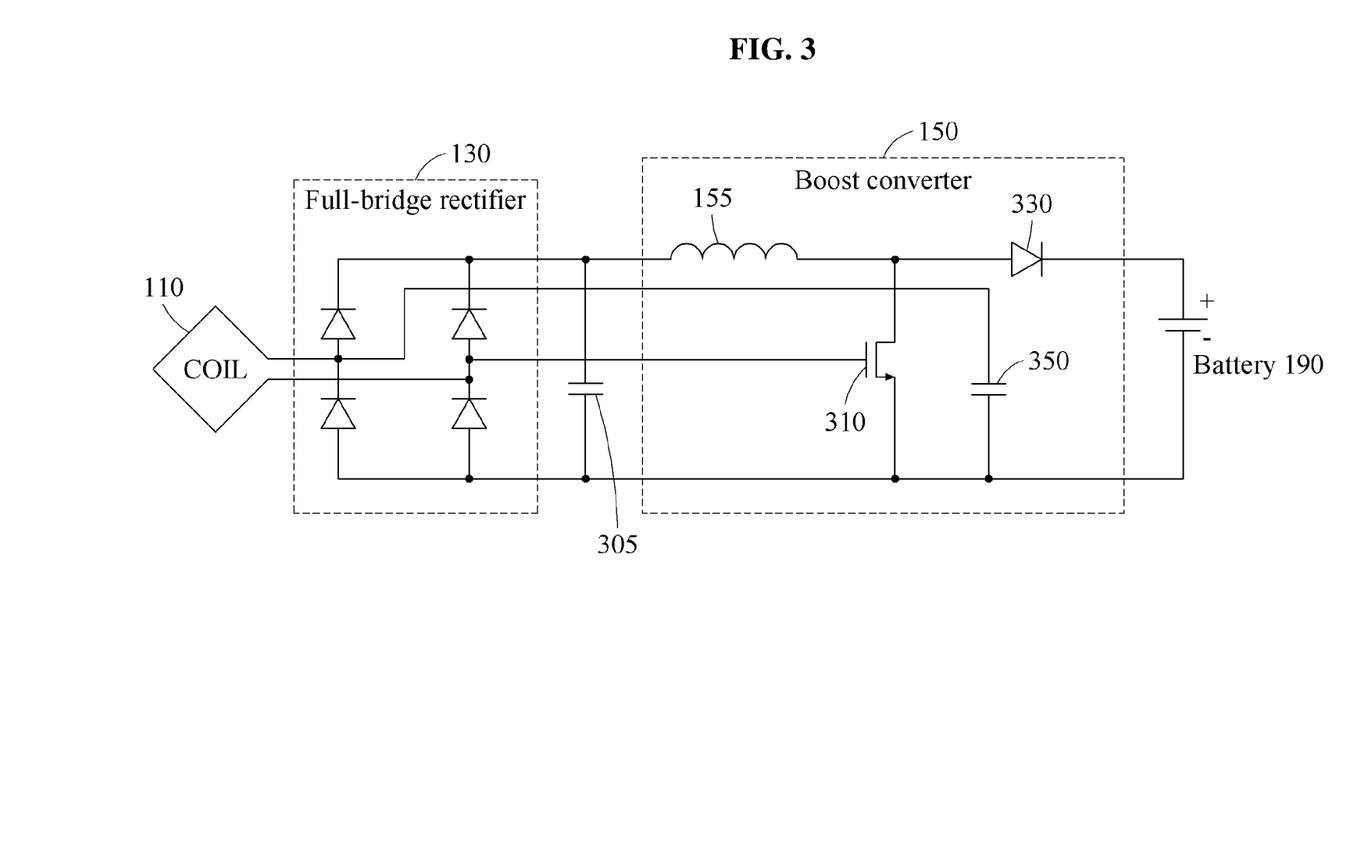
FIG. 3 illustrates an example of a circuit diagram of a wireless power receiver including a single boost converter.

FIG. 3 illustrates an example of a circuit diagram of a wireless power receiver including a single boost converter.

In general, a boost converter functions to increase an output voltage to be greater than an input voltage of DC-DC boosters. The boost converter repeats connection/disconnection between an input side and an output side periodically using a switch, such that a zero voltage and the input voltage of the boost converter may alternately appear on the output side of the boost converter. Here, an amplitude of voltage pulse or current may be adjusted by adjusting a ratio of ON/OFF of the switch, that is, the duty ratio of the voltage pulse or current.

In a wireless power receiver, an inductor may be used in the boost converter for battery charging. The inductance value of the inductor may be determined based on the switching frequency of the aforementioned switch.

For example, a conduction loss by a resistance component of each of the switch and the inductor and a switching loss for operating a power switch may cause degradation in the efficiency of the boost converter. To reduce the conduction loss, the resistance component of each of the switch and the inductor needs to be reduced. Therefore, the physical size of each of the inductor and the switch needs to increase. Here, according to an increase in the physical size, the resistance component may decrease, however, the switching loss may increase. The resistance component of the inductor decreases by increasing, for example, a Q value of the inductor. Also, the resistance component of the switch decreases by reducing, for example, the size of the switch and decreasing a capacitance. Also, an operating frequency of the switch needs to be lowered to decrease the switching loss. In this case, a required inductance for an operation of the inductor may increase.

As described above, a tradeoff may be present between the conduction loss and the switching loss. Accordingly, to reduce all of the conduction loss and the switching loss, an external inductor having a relatively great inductance and a relatively small resistance component is used, and an operating frequency of the boost converter is generally lowered. The external inductor may cause an increase in the size and the price of a wireless power reception system.

In one example, by using an RF voltage signal as a switching signal of a boost converter, it may be possible to prevent an increase in the switching loss by a high frequency occurring due to use of an on-chip inductor. Also, by configuring an inductor of the boost converter in an on-chip form, it may be possible to reduce the size and the price of a wireless power reception system.

FIG. 3 illustrates a circuit of a first boost converter 150. Referring to FIG. 3, the first boost converter 150 includes a first inductor 155, a first switch 310, a first diode 330, and a capacitor 350. In addition, the first boost converter 150 further includes a decoupling capacitor 305.

The decoupling capacitor 305 is connected in parallel to an input voltage of the first boost converter 150 and supplies a stable DC voltage to an output end when noise is included in the input voltage or when the input voltage is unstable.

The first inductor 155 generates a first inductor current for charging of the battery 190 based on a DC voltage converted by the full-bridge rectifier 130.

For example, the first switch 310 may form the first inductor current of the first inductor 155 by using, as a switching signal, an RF voltage signal, for example, a first RF voltage signal of a first half-sine waveform, which is generated by the full-bridge rectifier 130. The RF voltage signal applied to the first switch 310 may form an inductor current by controlling the powering ON/OFF of the first switch 310.

When the first switch 310 is turned ON, that is, connected, a resistance of the first switch 310 becomes zero theoretically. Accordingly, a current that passes through the first switch 310 may charge the first inductor 155 through a closed circuit.

When the first switch 310 is turned OFF, that is, disconnected, the current that is charged to the first inductor 155 may be discharged through the decoupling capacitor 305. Here, a current flowing from the first inductor 155 toward the first switch 310 may move to flow toward the first diode 330 and may charge the battery 190.

For example, the first switch 310 may be a metal-oxide semiconductor field effect transistor (MOSFET) switch. In one example, by using the RF voltage signal as the switching signal, an inductor current may be formed without using a buffer configured to operate the first switch 310.

Figure 5A:
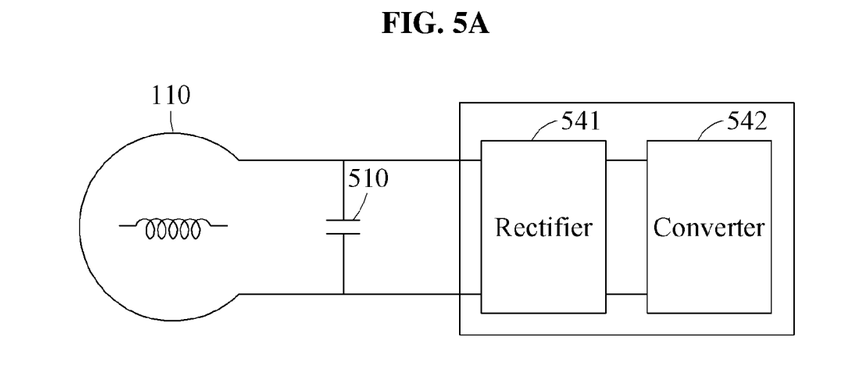
FIGS. 5A, 5B, and 5C illustrate examples of an impedance matching at a boost converter.

Here, a gate capacitor of the first switch 310 may be used as a matching capacitor of the antenna 110 that receives a first RF input. In general, the wireless power receiver includes a capacitor at the rear of the antenna 110 and performs impedance matching. In one example, a gate capacitance of the first switch 310 of the boost converter 150 may be used as a matching capacitor. The matching capacitor will be further described with reference to FIG. 5.

The first diode 330 transmits, to the battery 190, the first inductor current that is formed by the first inductor 155.

The capacitor 350 receives a second RF voltage signal that is generated by the full-bridge rectifier 130.

Figure 4:
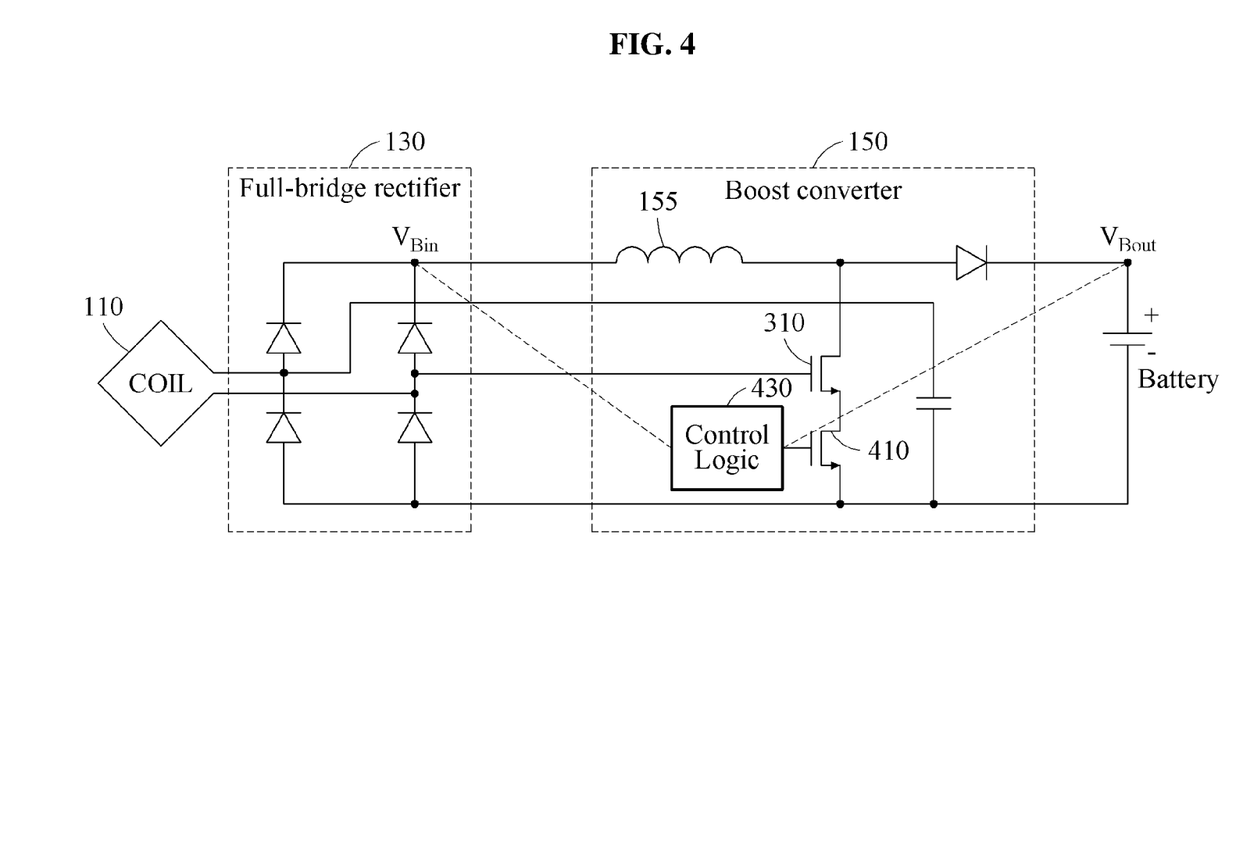
FIG. 4 illustrates an example of a circuit diagram of a wireless power receiver including an enable switch of a boost converter.

FIG. 4 illustrates an example of a circuit diagram of a wireless power receiver including an enable switch of a boost converter. Referring to FIG. 4, the wireless power receiver further includes a control logic 430 configured to control an enable switch 410 and an enable switch 410.

The enable switch 410 determines whether to enable a boosting operation of the boost converter 150. The enable switch 410, and the first switch 310 are connected in series.

The control logic 430 controls the powering ON/OFF operation of the enable switch 410. The control logic 430 determines the powering ON/OFF of the enable switch 410 based on a result of comparing each of an input voltage $V_{Bout}$ of the boost converter 150 and an output voltage $V_{Bout}$ of the boost converter 150 and each of threshold voltages, for example, $V_{th1}$ and $V_{th2}$, respectively preset for the input voltage $V_{Bin}$ of the boost converter 150 and the output voltage $V_{Bout}$ of the boost converter 150. For example, when the input voltage $V_{Bout}$ of the boost converter 150 is greater than a first threshold voltage $V_{th1}$ preset for the input voltage $V_{Bout}$ of the boost converter 150 and the output voltage $V_{Bout}$ of the boost converter 150 is less than a second threshold voltage $V_{th2}$ preset for the output voltage $V_{Bout}$ of the boost converter 150, the control logic 430 may turn OFF the enable switch 410 and may activate the boosting operation.

Also, when the input voltage $V_{Bout}$ of the boost converter 150 is less than or equal to the first threshold voltage $V_{th1}$ and the output voltage $V_{Bout}$ of the boost converter 150 is greater than or equal to the second threshold voltage $V_{th2}$, the control logic 430 may turn ON the enable switch 410 and may activate the boosting operation. Here, the input voltage $V_{Bout}$ of the boost converter 150 corresponds to a DC voltage that is output from the full-bridge rectifier 130 and the output voltage $V_{Bout}$ of the boost converter 150 corresponds to an input voltage of the battery 190.

For example, the first threshold voltage $V_{th1}$ may correspond to a minimum input voltage value capable of activating the boost converter 150. For example, the second threshold $V_{th2}$ may correspond to an output voltage value required by the boost converter 150.

The control logic 430 may control the powering ON/OFF of the enable switch 410 and may compare the input voltage $V_{Bout}$ of the boost converter 150 and the first threshold voltage $V_{th1}$ preset for the input voltage $V_{Bout}$ and compare the output voltage $V_{Bout}$ of the boost converter 150 and the second threshold voltage $V_{th2}$ preset for the output voltage $V_{Bout}$, such that the boost converter 150 may operate only when a voltage is sufficient to charge the battery 190.

For example, when the input voltage $V_{Bout}$ of the boost converter 150 is greater than the first threshold voltage $V_{th1}$ preset for the input voltage $V_{Bin}$ of the boost converter 150 and the output voltage $V_{Bout}$ of the boost converter 150 is less than the second threshold voltage $V_{th2}$ preset for the output voltage $V_{Bout}$ of the boost converter 150, the control logic 430 may turn OFF the enable switch 410 and turn ON the boost converter 150. As the boost converter 150 is turned ON, the battery 190 may be charged.

Alternatively, when the input voltage $V_{Bin}$ of the boost converter 150 is less than or equal to the first threshold voltage $V_{th1}$ and the output voltage $V_{Bout}$ of the boost converter 150 is greater than or equal to the second threshold voltage $V_{th2}$, the control logic 430 may turn ON the enable switch 410 and turn OFF the boost converter 150. As the boost converter 150 is turned OFF, the battery 190 may not be charged.

In one example, a controller includes, or is connected to, one or more memories storing the control logic 430 that is executed by the controller.

Figure 5B:
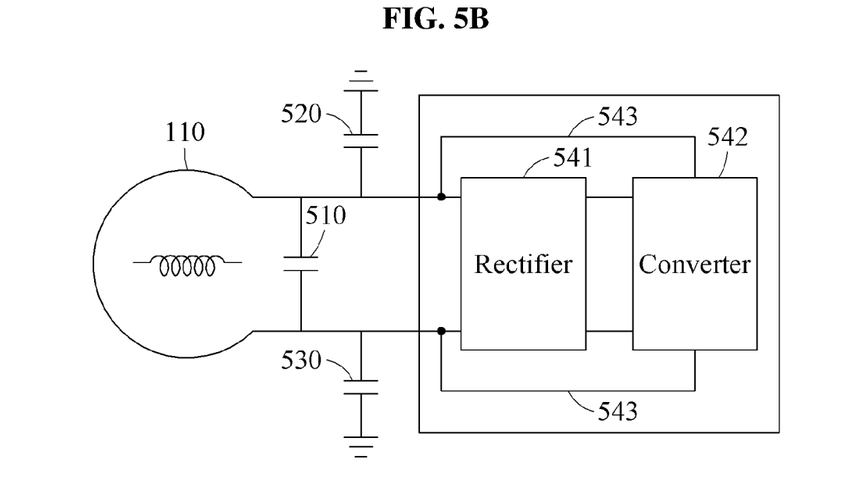
Figure 5C:
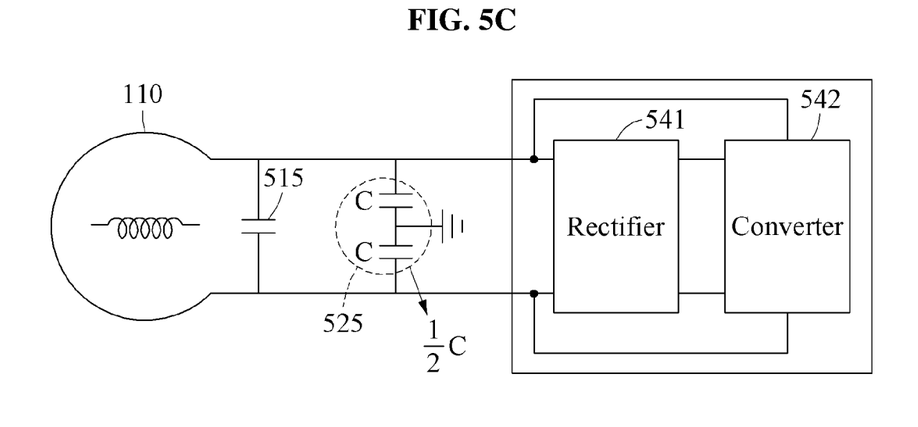

FIGS. 5A, 5B, and 5C illustrate examples of an impedance matching at a boost converter. Referring to FIG. 5A, a matching capacitor 510 is required for impedance matching between the antenna 110 and a rectifier 541. The impedance matching is to optimize power transmission between an RF element and a circuit. For example, the impedance matching may be used to reduce a power transmission loss between the antenna 110 and the rectifier 541. When a converter 542 does not perform impedance matching, an amount of power transmitted from the antenna 110 to the rectifier 541 may decrease and accordingly, an amount of input power of the boost converter 150 may decrease. The rectifier 541 may be, for example, the full-bridge rectifier 130 of FIG. 1 and the converter 542 may be, for example, the boost converter 150.

In one example, an RF voltage signal may be immediately connected to a first switch of the boost converter 150. In this case, referring to FIG. 5B, parasitic capacitances 520 and 530 of FIG. 5B may occur due to a gate capacitor of the first switch. The parasitic capacitances 520 and 530 are used as the matching capacitor 510 for impedance matching with the capacitance of the antenna 110 and do not affect the operation of the wireless power receiver.

For example, referring to FIG. 5A, the imaginary number portion of impedance may need to substantially become closer to zero, and the real number portion of impedance may need to be a preset numerical value, for example, 50 ohms, through impedance matching. A matching capacitance of the matching capacitor 510 may be determined to offset the imaginary number portion of impedance occurring due to an inductance of the antenna 110.

Referring to FIG. 5B, in one example, when a connection line 543 is added between the antenna 110 and the converter 542, an end of the antenna 110 may be affected by the parasitic capacitances 520 and 530.

Referring to FIG. 5C, the parasitic capacitances 520 and 530 of FIG. 5B may be switched to an equivalent capacitor 525, and the equivalent capacitor 525 may be used as a portion of the matching capacitor 510. For example, a matching capacitance of the matching capacitor 510 may be determined based on an equivalent capacitance of the equivalent capacitor 525 such that the capacitance by the combination of the equivalent capacitor 525 and the matching capacitor 510 may be identical to the matching capacitance of the matching capacitor 510 of FIG. 5A.

Figure 6:
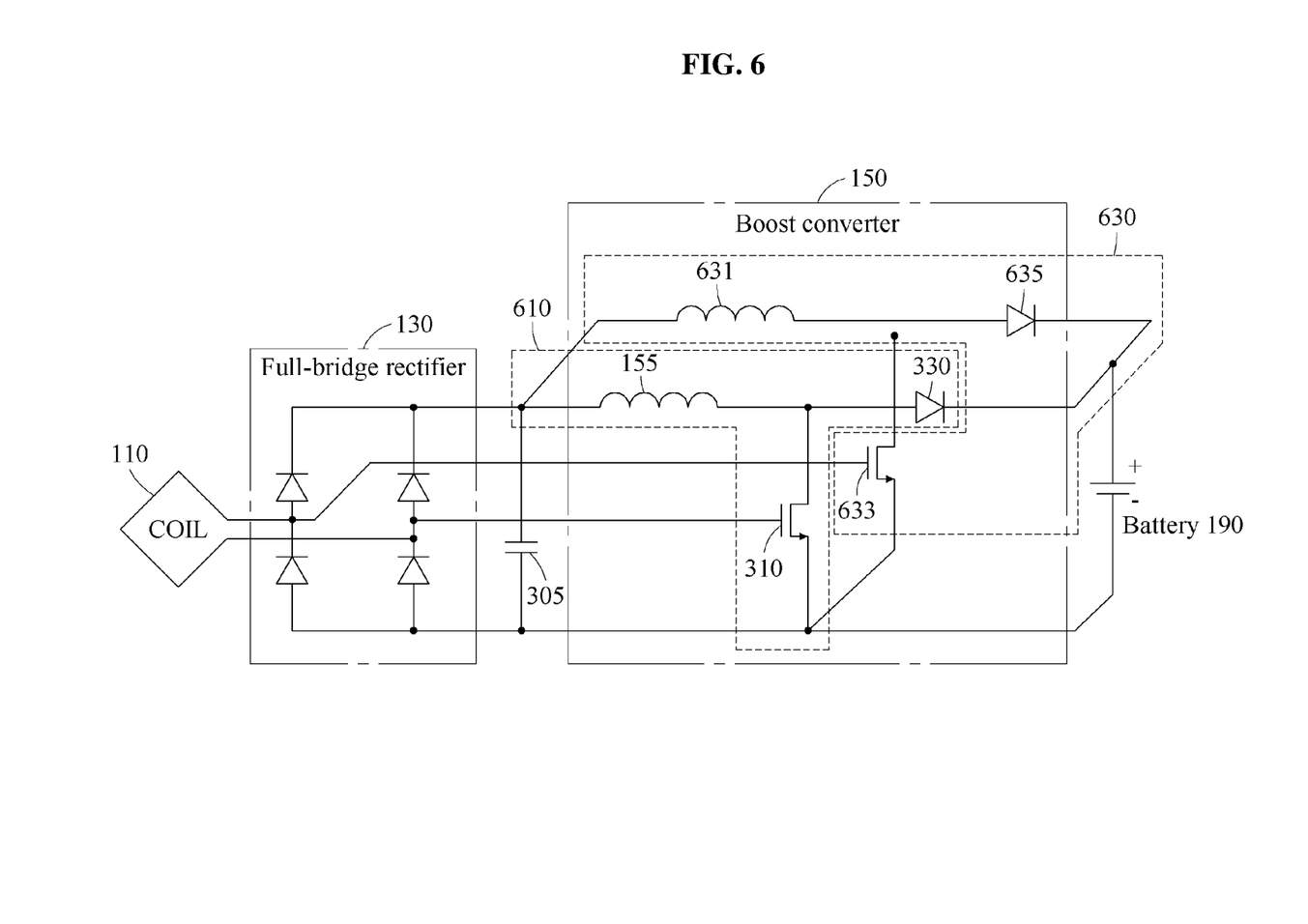
FIG. 6 illustrates an example of a circuit diagram of a wireless power receiver including two boost converters.

FIG. 6 illustrates an example of a circuit diagram of a wireless power receiver including two boost converters. Referring to FIG. 6, the wireless power receiver includes a first boost converter 610 and a second boost converter 630.

The first boost converter 610 forms a first inductor current of the first inductor 155 by using a first RF voltage signal generated by the full-bridge rectifier 130 as a switching signal of the first switch 310 and transmits the first inductor current to the battery 190. A detailed configuration and operation of the first boost converter 610 may further refer to FIG. 3.

The second boost converter 630 forms a second inductor current of a second inductor 631 by using a second RF voltage signal generated by the full-bridge rectifier 130 as a switching signal of a second switch 633 and transmits the second inductor current to the battery 190.

The second boost converter 630 may include the second inductor 631, the second switch 633, and a second diode 635.

The second inductor 631 generates the second inductor current for charging of the battery 190 based on a DC voltage converted by the full-bridge rectifier 130.

The second switch 633 forms the second inductor current of the second inductor 631 by using the second RF voltage signal as the switching signal.

The second diode 635 transmits the second inductor current to the battery 190.

For example, either one or both of the first inductor 155 and the second inductor 631 may be an on-chip inductor.

In one example, it is possible to enhance the power conversion efficiency and to remove asymmetry of impedance matching by controlling two on-chip inductors, for example, the first inductor 155 and the second inductor 631, using an RF voltage signal of a differential half-sine waveform.

Figure 7:
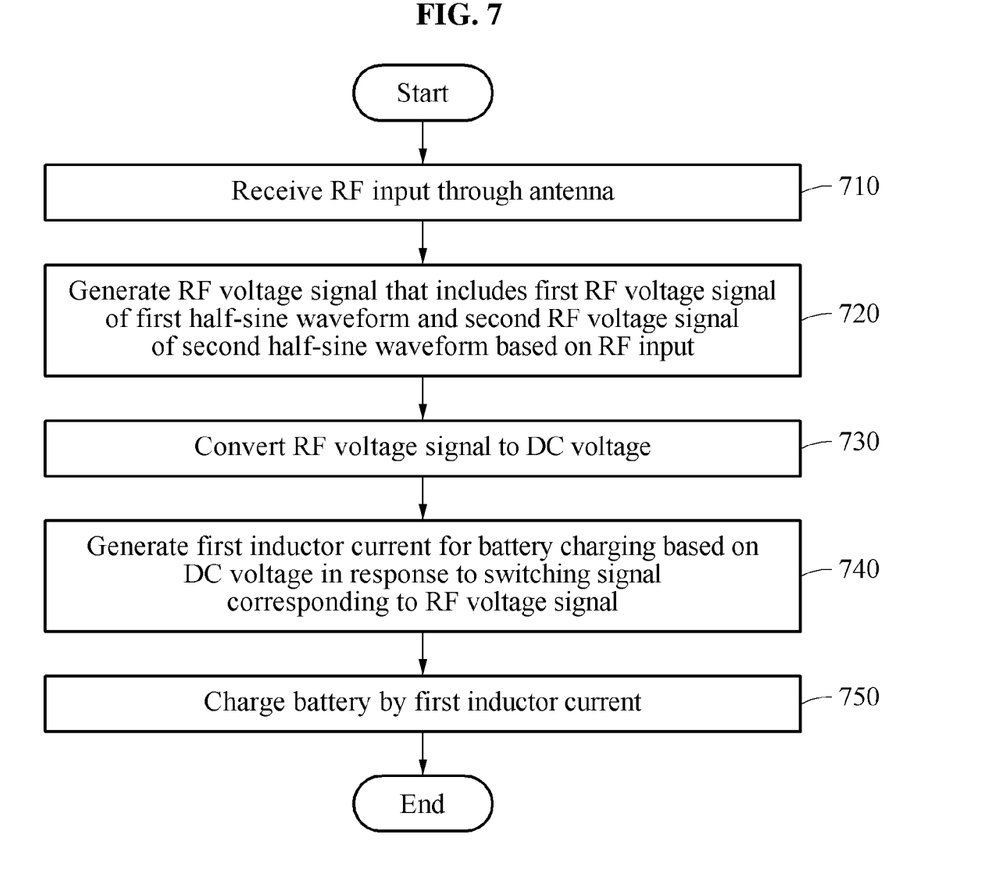
FIG. 7 illustrates an example of a method of controlling a wireless power receiver.

FIG. 7 illustrates an example of a method of controlling a wireless power receiver. Referring to FIG. 7, in operation 710, the wireless power receiver receives an RF input through an antenna.

In operation 720, the wireless power receiver generates an RF voltage signal that includes a first RF voltage signal of a first half-sine waveform and a second RF voltage signal of a second half-sine waveform based on the RF input that is received in operation 710.

In operation 730, the wireless power receiver converts, to a DC voltage, the RF voltage signal that is generated in operation 720.

In operation 740, the wireless power receiver generates a first inductor current for battery charging based on the DC voltage, in response to a switching signal corresponding to the RF voltage signal that is generated in operation 720.

In operation 750, the wireless power receiver charges a battery by the first inductor current that is generated in operation 740.

Depending on examples, the wireless power receiver may control a boosting operation in response to a switching signal, based on a result of comparing a DC voltage and a preset first threshold voltage and a result of comparing a charging voltage of a battery and a preset second threshold voltage. For example, when the DC voltage is less than or equal to the first threshold voltage or the battery charging voltage is greater than or equal to the second threshold voltage, the wireless power receiver may inactivate the boosting operation. Also, when the DC voltage is greater than the first threshold voltage and the battery charging voltage is less than the second threshold voltage, the wireless power receiver may activate the boosting operation.

The apparatuses and other apparatuses, units, modules, devices, and other components described herein are implemented by hardware components. Examples of hardware components that may be used to perform the operations described in this application where appropriate include controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. A hardware component may have any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The methods that perform the operations described in this application are performed by computing hardware, for example, by one or more processors or computers, implemented as described above executing instructions or software to perform the operations described in this application that are performed by the methods. For example, a single operation or two or more operations may be performed by a single processor, or two or more processors, or a processor and a controller. One or more operations may be performed by one or more processors, or a processor and a controller, and one or more other operations may be performed by one or more other processors, or another processor and another controller. One or more processors, or a processor and a controller, may perform a single operation, or two or more operations.

Instructions or software to control computing hardware, for example, one or more processors or computers, to implement the hardware components and perform the methods as described above may be written as computer programs, code segments, instructions or any combination thereof, for individually or collectively instructing or configuring the one or more processors or computers to operate as a machine or special-purpose computer to perform the operations that are performed by the hardware components and the methods as described above. In one example, the instructions or software include machine code that is directly executed by the one or more processors or computers, such as machine code produced by a compiler. In another example, the instructions or software includes higher-level code that is executed by the one or more processors or computer using an interpreter. The instructions or software may be written using any programming language based on the block diagrams and the flow charts illustrated in the drawings and the corresponding descriptions in the specification, which disclose algorithms for performing the operations that are performed by the hardware components and the methods as described above.

The instructions or software to control computing hardware, for example, one or more processors or computers, to implement the hardware components and perform the methods as described above, and any associated data, data files, and data structures, may be recorded, stored, or fixed in or on one or more non-transitory computer-readable storage media. Examples of a non-transitory computer-readable storage medium include read-only memory (ROM), random-access programmable read only memory (PROM), electrically erasable programmable read-only memory (EEPROM), random-access memory (RAM), dynamic random access memory (DRAM), static random access memory (SRAM), flash memory, non-volatile memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, blue-ray or optical disk storage, hard disk drive (HDD), solid state drive (SSD), flash memory, a card type memory such as multimedia card micro or a card (for example, secure digital (SD) or extreme digital (XD)), magnetic tapes, floppy disks, magneto-optical data storage devices, optical data storage devices, hard disks, solid-state disks, and any other device that is configured to store the instructions or software and any associated data, data files, and data structures in a non-transitory manner and provide the instructions or software and any associated data, data files, and data structures to one or more processors or computers so that the one or more processors or computers can execute the instructions. In one example, the instructions or software and any associated data, data files, and data structures are distributed over network-coupled computer systems so that the instructions and software and any associated data, data files, and data structures are stored, accessed, and executed in a distributed fashion by the one or more processors or computers.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A wireless power receiver, comprising:
    a rectifier configured to convert a radio frequency (RF) voltage signal, generated based on an RF input, to a direct current (DC) voltage; and
    a boost converter configured to generate a voltage for battery charging using the RF voltage signal as a switching signal,
    wherein the DC voltage is applied to an input of the boost converter, and
    wherein the RF voltage signal is applied to a gate of a switch of the boost converter.

2. The wireless power receiver of claim 1, wherein the rectifier is a full-bridge rectifier.

3. The wireless power receiver of claim 1, wherein the boost converter comprises:
    a first inductor configured to generate a first inductor current for the battery charging based on the DC voltage;
    a first switch configured to form the first inductor current of the first inductor using the RF voltage signal as the switching signal; and
    a first diode configured to transmit the first inductor current.

4. The wireless power receiver of claim 3, wherein the RF voltage signal comprises a first RF voltage signal of a first half-sine waveform and a second RF voltage signal of a second half-sine waveform.

5. The wireless power receiver of claim 4, wherein the first switch is configured to form the first inductor current using the first RF voltage signal as the switching signal.

6. The wireless power receiver of claim 4, wherein the boost converter further comprises a capacitor configured to receive the second RF voltage signal.

7. The wireless power receiver of claim 3, wherein a gate capacitor of the first switch is used as a matching capacitor of an antenna configured to receive the RF input.

8. The wireless power receiver of claim 7, wherein the boost converter further comprises:
    an enable switch configured to connect in series to the first switch and to determine whether to enable a boosting operation of the boost converter; and
    a control logic configured to control powering ON/OFF of the enable switch based on a result of comparing each of an input voltage of the boost converter and an output voltage of the boost converter, and a threshold voltage preset for each of the input voltage of the boost converter and the output voltage of the boost converter.

9. The wireless power receiver of claim 8, wherein the control logic is configured to turn OFF the enable switch and turn ON the boost converter in response to the input voltage of the boost converter being greater than a first threshold voltage preset for the input voltage of the boost converter and the output voltage of the boost converter being less than a second threshold voltage preset for the output voltage of the boost converter, and
    the control logic is configured to turn ON the enable switch and turn OFF the boost converter in response to the input voltage of the boost converter being less than or equal to the first threshold voltage and the output voltage of the boost converter being greater than or equal to the second threshold voltage.

10. The wireless power receiver of claim 3, wherein the boost converter charges the battery using the first inductor current.

11. The wireless power receiver of claim 1, wherein the RF voltage signal comprises a first RF voltage signal of a first half-sine waveform and a second RF voltage signal of a second half-sine waveform, and
the boost converter comprises:
a first boost converter configured to form and transmit a first inductor current of a first inductor by using the first RF voltage signal as a switching signal of a first switch; and
a second boost converter configured to form and transmit a second inductor current of a second inductor by using the second RF voltage signal as a switching signal of a second switch.

12. The wireless power receiver of claim 11, wherein the second boost converter comprises:
the second inductor configured to generate the second inductor current for the battery charging based on the DC voltage;
a second switch configured to form the second inductor current of the second inductor of the second by using the second RF voltage signal as the switching of the second inductor; and
a second diode configured to transmit the second inductor current.

13. The wireless power receiver of claim 11, wherein either one or both of the first inductor and the second inductor is an on-chip inductor.

14. A method of controlling a wireless power receiver, the method comprising:
receiving a radio frequency (RF) input through an antenna;
generating an RF voltage signal that comprises a first RF voltage signal of a first half-sine waveform and a second RF voltage signal of a second half-sine waveform based on the RF input;
converting the RF voltage signal to a direct current (DC) voltage; and
controlling a boosting operation of a boost converter for charging a battery, including:
generating, by the boost converter, a first inductor current based on the DC voltage, in response to a switching signal, corresponding to the RF voltage signal, being applied to a gate of a switch of the boost converter; and
charging the battery using the first inductor current.

15. The method of claim 14, wherein the controlling of the boosting operation comprises controlling the boosting operation in response to the switching signal, based on a result of comparing the DC voltage and a preset first threshold voltage, and a result of comparing a charging voltage of the battery and a preset second threshold voltage.

16. The method of claim 15, wherein the controlling of the boosting operation comprises:
inactivating the boosting operation in response to the DC voltage being less than or equal to the first threshold voltage, or the battery charging voltage being greater than or equal to the second threshold voltage; and
activating the boosting operation in response to the DC voltage being greater than the first threshold voltage and the charging voltage of the battery being less than the second threshold voltage.

17. A non-transitory computer-readable storage medium storing instructions that, when executed by a computer, cause the processor to perform the method of claim 14.

18. A method of controlling a wireless power receiver, comprising:
receiving a radio frequency (RF) input;
converting, using a rectifier, a radio frequency (RF) voltage signal of the RF input signal to a direct current (DC) voltage; and
generating a voltage for charging a battery based on using the RF voltage signal as a switching signal in a boost converter,
wherein the DC voltage is applied to an input of the boost converter, and
wherein the RF voltage signal is applied to a gate of a switch of the boost converter.

19. The method of claim 18, wherein the rectifier is a full-bridge rectifier.

20. The method of claim 18, wherein the boost converter comprises:
a first inductor configured to generate a first inductor current for the charging of the battery based on the DC voltage;
a first switch configured to form the first inductor current of the first inductor using the RF voltage signal as the switching signal; and
a first diode configured to transmit the first inductor current.

21. The method of claim 20, wherein the RF voltage signal comprises a first RF voltage signal of a first half-sine waveform and a second RF voltage signal of a second half-sine waveform.

22. The method of claim 21, wherein the first switch is configured to form the first inductor current using the first RF voltage signal as the switching signal.

23. The method of claim 21, wherein the boost converter further comprises a capacitor configured to receive the second RF voltage signal.

24. The method of claim 20, wherein a gate capacitor of the first switch is used as a matching capacitor of an antenna configured to receive the RF input.

25. The method of claim 20, wherein the boost converter further comprises:
an enable switch configured to connect in series to the first switch and to determine whether to enable a boosting operation of the boost converter; and
a control logic configured to control powering ON/OFF of the enable switch based on a result of comparing each of an input voltage of the boost converter and an output voltage of the boost converter, and a threshold voltage preset for each of the input voltage of the boost converter and the output voltage of the boost converter.

26. The method of claim 25, wherein the control logic is configured to turn OFF the enable switch and turn ON the boost converter in response to the input voltage of the boost converter being greater than a first threshold voltage preset for the input voltage of the boost converter and the output voltage of the boost converter being less than a second threshold voltage preset for the output voltage of the boost converter, and
the control logic is configured to turn ON the enable switch and turn OFF the boost converter in response to the input voltage of the boost converter being less than or equal to the first threshold voltage and the output voltage of the boost converter being greater than or equal to the second threshold voltage.

27. The method of claim 20, further comprising charging the battery using the first inductor current.

* * * * *